United States Patent [19]
Herbert

[11] Patent Number: 5,093,646
[45] Date of Patent: Mar. 3, 1992

[54] HIGH FREQUENCY MATRIX TRANSFORMER

[75] Inventor: Edward Herbert, Canton, Conn.

[73] Assignee: FMTT, Inc., Canton, Conn.

[21] Appl. No.: 322,521

[22] Filed: Mar. 13, 1989

Related U.S. Application Data

[62] Division of Ser. No. 187,931, Apr. 29, 1988, Pat. No. 4,845,606.

[51] Int. Cl.$^5$ .................. H01F 27/28; H02M 3/335
[52] U.S. Cl. .................. 336/225; 336/221; 336/222; 363/24; 323/361; 323/355
[58] Field of Search ............... 336/110, 145, 147, 180, 336/182, 184, 212, 220, 221, 222, 225; 323/355, 356, 357, 358, 359, 361, 363; 363/170, 171, 152, 153, 64, 24

[56]  References Cited

U.S. PATENT DOCUMENTS

| | | | |
|---|---|---|---|
| 3,008,107 | 9/1958 | Stearn | 336/180 |
| 4,665,357 | 5/1987 | Herbert | 323/361 |
| 4,845,606 | 7/1989 | Herbert | 363/24 |

Primary Examiner—Leo P. Picard
Assistant Examiner—Bot Lee Ledynh
Attorney, Agent, or Firm—McCormick, Paulding & Huber

[57]  ABSTRACT

A high frequency matrix transformer comprises a plurality of interdependent magnetic elements interwired as a transformer. The various component parts of the high frequency transformer are arranged and interwired to provide a transformer having very low leakage inductance and very good coupling from the primary to the secondary. The high frequency matrix transformer is particularly well adapted for transformers requiring high equivalent turns ratios, high frequency, high power, and high dielectric isolation. It can have a plurality of parallel secondaries, which can source current to parallel rectifier circuits with current sharing. It can also have a plurality of parallel primary circuits, which also will current share, to balance the load between source switching circuits, or to provide dual input voltage capability (i.e., 120/240 volts). The high frequency matrix transformer tends to be spread out, and can be very flat, making it easy to ventilate or heat sink. The high frequency matrix transformer having push pull windings can include the primary switching device and secondary rectifying device within its windings, so that the transformer as a whole has direct current inputs and outputs.

19 Claims, 7 Drawing Sheets

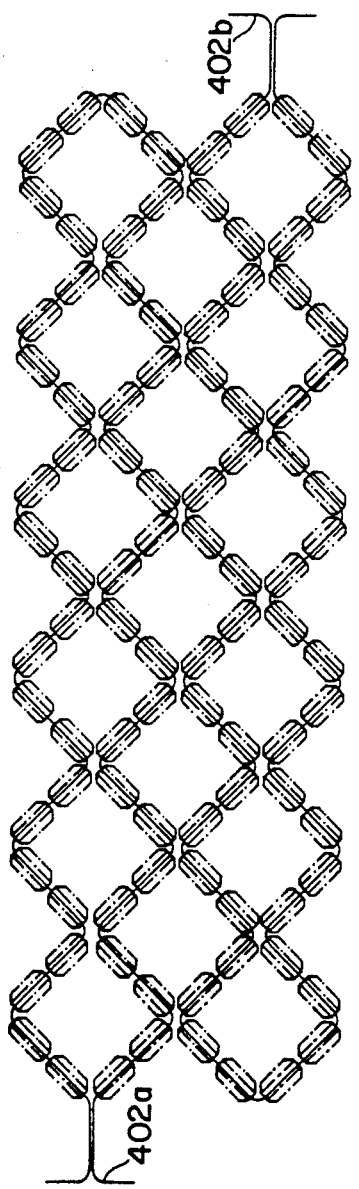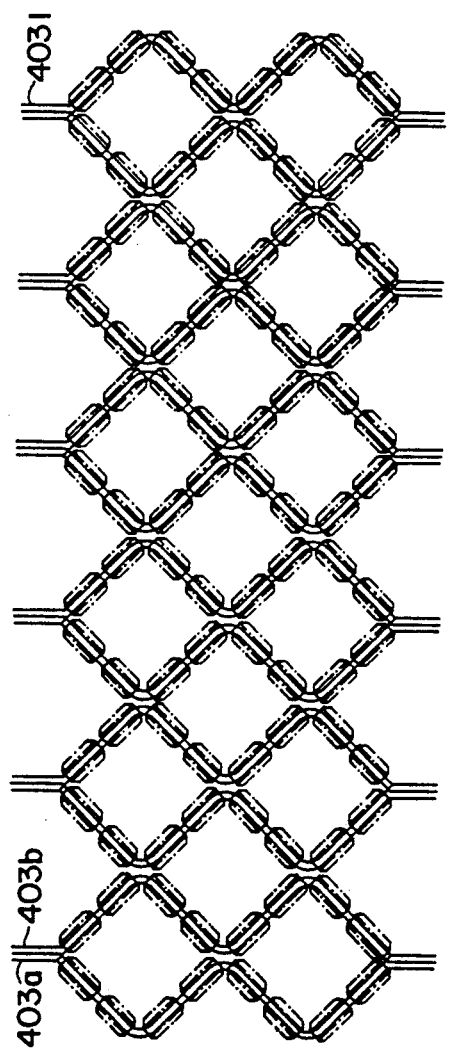
FIG. 4P
FIG. 4S

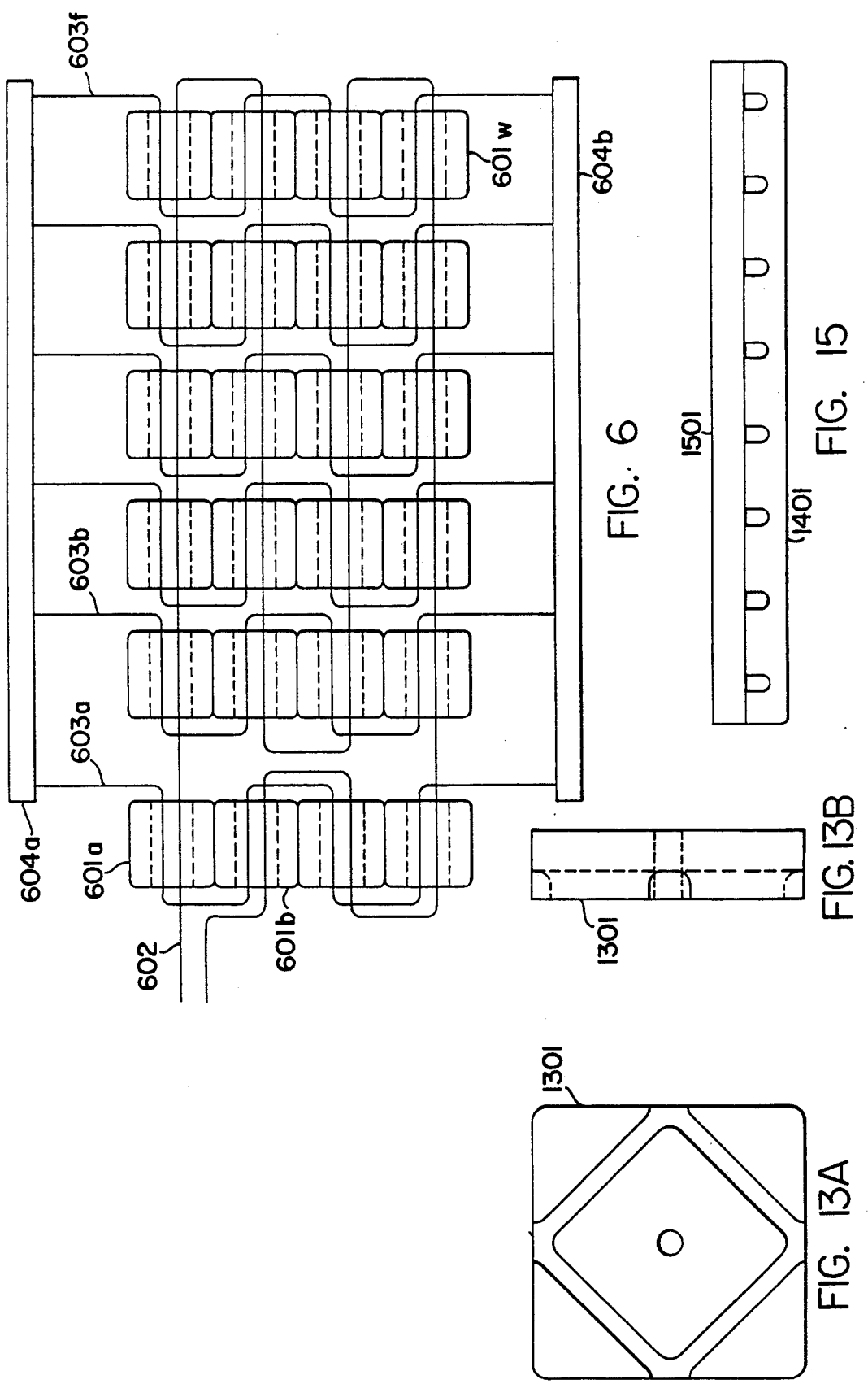

HIGH FREQUENCY MATRIX TRANSFORMER

CROSS REFERENCE TO RELATED APPLICATIONS

The present application is a division of application Ser. No. 187,931 filed on Apr. 29, 1988, now U.S. Pat. No. 4,845,606.

BACKGROUND OF THE INVENTION

1. Field of the Invention

This invention relates to transformers, and in particular, to high frequency power transformers.

2. Description of Prior Art

There has been considerable development activity to increase the frequency of power transformers, particularly for switch mode power supplies. Those modifications which must be made to a transformer to increase its power capacity tend to severely compromise its performance at higher frequencies. If it is optimized for high frequency, its power capabilities are limited. This is particularly true for transformers having larger turns ratios, or transformers which must have high dielectric isolation.

A number of transformer designs have been published using "planar" technology, in which the windings of the transformer are fabricated of foil or sheet stock. Interleaving of the windings has been used to improve coupling.

U.S. Pat. No. 4,665,357, Herbert, May 12, 1987, teaches the art of matrix transformers. A matrix transformer is made of a plurality of interdependent magnetic circuits, arranged in a matrix, between and among which electrical conductors are interwired, the whole cooperating to behave as a transformer. The matrix transformer has several advantageous features, among them compact size, good heat dissipation and high current capability. A matrix transformer can be very flat indeed, nearly planar, and can be built using printed circuit board techniques. A matrix transformer can insure current sharing between parallel power sources, and/or between parallel loads.

SUMMARY OF THE INVENTION

It is an objective of this invention to teach embodiments of the matrix transformer which have novel features to improve its characteristics at high frequencies and high power. It is a further objective to teach design methods and techniques to optimize the matrix transformer for high frequency, high power applications, and to adapt it to various circuit topologies, thermal and physical constraints and packaging objectives.

BRIEF DESCRIPTION OF THE DRAWINGS

FIG. 4P shows an alternative primary arrangement for the transformer of FIG. 3.

FIG. 4S shows an alternative secondary arrangement for the transformer of FIG. 3.

FIG. 6 shows another embodiment of the high frequency matrix transformer.

FIGS. 12, 13A and 13B show a transformer core for a high frequency matrix transformer.

FIGS. 14A, 14B and 15 show another transformer core for a high frequency matrix transformer.

PREFERRED EMBODIMENT OF THE INVENTION

Figure 1:
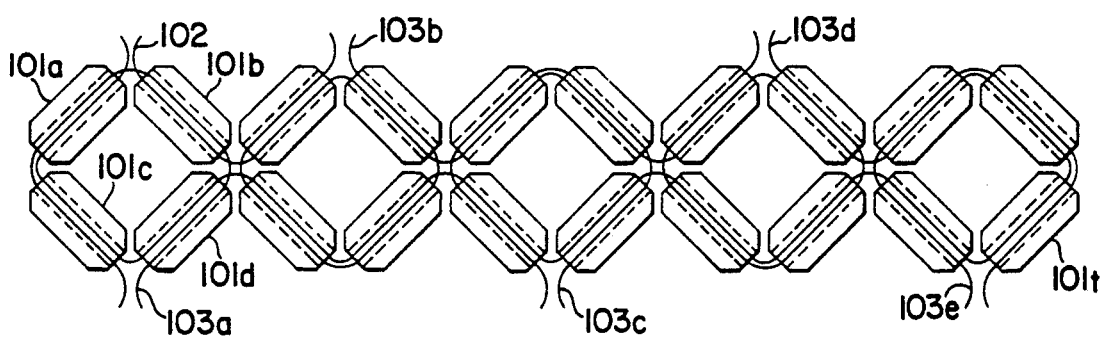
FIG. 1 shows one embodiment of a high frequency matrix transformer.

The art of designing and manufacturing high frequency matrix transformers is adaptable to a very wide variety of shapes, sizes and configurations. The principles, once learned, will enable the skilled practitioner to tailor individual designs to a number of diverse requirements.

The matrix transformer is made of many magnetic elements, which are arranged and interwired to behave collectively as a transformer.

Transformers belong to a broad family of static devices in which electric currents in conductors interact by means of magnetic induction with changing fluxes in magnetic cores. These include potential transformers, current transformers, flyback transformers, induction coils, "constant current output" transformers, multiple winding inductors and inductors. "Matrix transformer" is used herein as a generic term including any of these devices when they are built using an array of smaller interdependent magnetic elements interwired as a whole.

The matrix transformer designed in this way functions as an ordinary transformer, but because of the manner in which the various elemental parts cooperate interdependently, it has some unique characteristics which can be used to advantage in many applications.

Matrix transformers can also be designed which have characteristics which no single core device could have.

The magnetic elements can be small cores of ordinary design, such as C cores, E-I cores, pot cores or toroids, but alternatively can be one of several new geometries having multiple magnetic return paths such as two parallel plates bridged by a multitude of posts, a plurality of modified cross cores, or a plate of magnetic material having a plurality of holes therein. Different types of interdependent magnetic elements can be inter-mixed in an interdependent matrix array as long as the rules of transformers are followed.

The matrix transformer can be very flat, and the electrical circuits can be made using printed wiring board techniques.

There is a high degree of flexibility and discretion in the design of matrix transformers, including, but not limited to, the number of magnetic elements, the detailed design of the elements, and the physical arrangements of the elements. Also, the windings of the matrix transformer can be arranged in different ways, and there is flexibility in choosing how and where a particular winding enters and exits the transformer. The voltages and the currents in the matrix transformer have a definite relationship, one to another, and this information can be exploited to optimize the design. For additional details related to the general construction and operation of a matrix transformer, reference may be made to the above referenced U.S. Pat. No. 4,665,357 the disclosure of which is hereby incorporated by reference.

As a generality, it is advantageous to minimize the leakage inductance in a transformer designed for high frequency operation. In the high frequency matrix transformer, the principal source of leakage inductance is in the external wiring. In many applications, it is best to have the start and the end a winding very close together, and terminate it to the external circuitry with very short connections. If, however, the external circuit's connections are spaced apart, it would be better to arrange the matrix transformer windings so that the start and the end are at different places, each in very close proximity to its external connection point. This invention teaches how to meet these objectives.

It is the nature of matrix transformers that there are a plurality of parallel windings. In as much as these windings normally interconnect different elements, or groups of elements, the terminations of the different parallel windings will naturally be located at different places. In some applications, it is beneficial to arrange the matrix transformer to spread these various inputs and outputs as much as possible. In others, it is better to draw them together toward one spot, or perhaps in groups. This invention teaches how to meet these objectives.

The reason that the leakage inductance of the external leads is a problem is that they normally carry high frequency alternating currents. This invention teaches that certain components, such as rectifiers and switching means, can be included within the matrix transformer. If this is done, the external leads may be carrying direct current only, and lead inductance would be of no consequence. (This is the case where the transformer wave shape is a square wave. It is not true for sine waves, or pulse width modulated square waves). This embodiment allows filter components to be in very close proximity to the transformer.

A high frequency matrix transformer may include one or several of the above features.

FIG. 1 shows a diagrammatic representation of a high frequency matrix transformer having an equivalent turns ratio of five to one. The matrix dimensions are twenty to four, with one primary winding 102 connecting 20 magnetic elements 101a,b,c,d-t. Five secondary windings 103a,b,c,d,e connect four elements each.

Figure 1P:
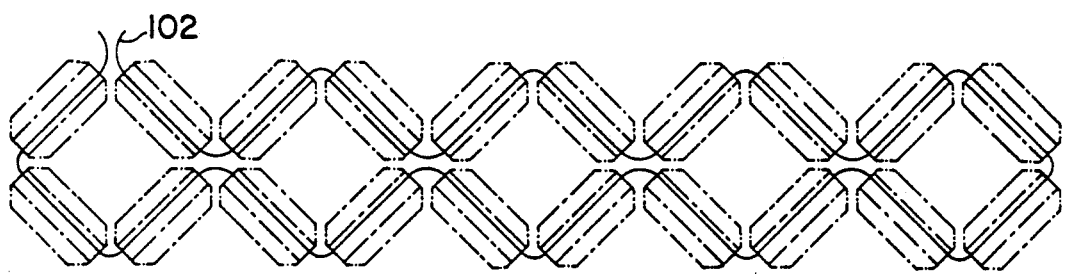
FIG. 1P shows the transformer of FIG. 1, with the primary winding emphasized.

FIG. 1P shows the high frequency matrix transformer of FIG. 1, with the primary winding 102 emphasized.

Figure 1S:
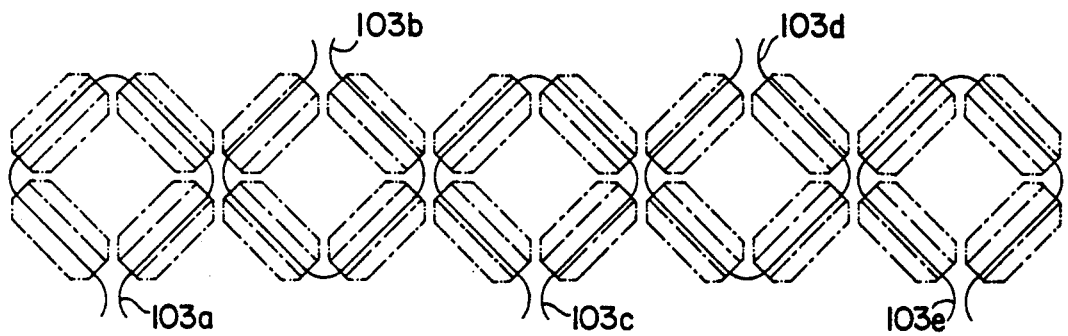
FIG. 1S shows the transformer of FIG. 1, with the secondary windings emphasized.

FIG. 1S shows the high frequency matrix transformer of FIG. 1, with the secondary windings 103a,b,c,d,e emphasized.

The transformer of FIG. 1 is a very basic high frequency matrix transformer. The magnetic elements 101a-t are arranged in five groups of four. The primary circuit 102 has one path making a single pass through all of the magnetic elements 101a-t. The secondary circuit 103 consists of five parallel paths, each making a single pass through a group of four magnetic elements.

It must be understood that the secondary windings of the matrix transformer are intended to be paralleled, polarity being carefully observed. This being done, the output voltage of all of the parallel paths must be equal, and the total output current is the sum of the currents of each part.

There are applications where the outputs can be used individually, and they can be electrically isolated. An example would be for isolated drives for switching circuits in switch mode power supplies. Each output will have some of the characteristics of a current source, so it is preferred that the loads have essentially equal impedance, to result in essentially equal voltages. (If a matrix transformer is designed to have isolated secondaries with unequal loads, careful attention will have to be paid to the flux capacity of each element, and the voltage from element to element will differ, or a balancing winding should be added).

It must also be understood that the terms "primary" and "secondary", and references to the nature of the loads and sources are for illustration, and are not limitations. As with any transformer, "primary" and "secondary" can be spoiled arbitrarily to different windings. While the nature of the power source and the loads may affect the design details, they in no way limit the principle of operation or the teachings of this invention.

All the laws of transformers apply to each magnetic element 101a-t with its associated portion of the primary circuit 102 and the secondary circuit 103. The volts per turn of all windings in any element must be the same. In the case of the transformer elements of the matrix transformer of FIG. 1, each element has a primary wire and a secondary wire which makes a single pass through the element. Therefor the number of "turns" of each "winding" is one. Since this is often the case for matrix transformers, "turns", "turns ratio" and "windings" are misnomers, but their use is continued, as it is the accepted jargon of the art of transformers.

Also, the sum of the ampere-turns of each transformer element must equal zero (ignoring magnetization current). This requirement leads to a very interesting and valuable characteristic of matrix transformers, which is that the currents in the primary circuit 102 and the currents in each of the parallel paths of the secondary circuit 103 must all be equal. (If either or both of the circuits has multiple turns on each element, the law still applies, but the number of turns must be factored in).

The equivalent turns ratio of the matrix transformer of FIG. 1 is five to one. This can be shown by examining either the voltage or the current relationship, applying the transformer laws to each of the interdependent magnetic elements, then taking the sums. The primary circuit 102 drops through twenty elements, and the secondary circuit 103 is sourced through four elements in each of the parallel paths. Since the voltage of each "turn" of each element must be equal, the secondary voltage will be 4/20ths (1/5th) of the primary voltage. Likewise, the primary circuit 102 has one path, and the secondary 103 is divided into five parallel paths. Since the current in each path is equal, the total secondary current is five times the primary current.

The matrix transformer tends to be flat, almost planar, and can be much lower in height than a conventional transformer of equivalent volt-amp capacity. This is particularly true for high current applications, where wire size and aperture area can be dominant criteria determining the core size of a conventional transformer.

Being flat, and essentially open in construction, cooling is readily accomplished. There will be no extreme hot spots.

In a matrix transformer, the higher current circuits tend to be parallel circuits which can be very short. Resistance can therefor be kept to a minimum.

Figures 2, 2P, 2S:
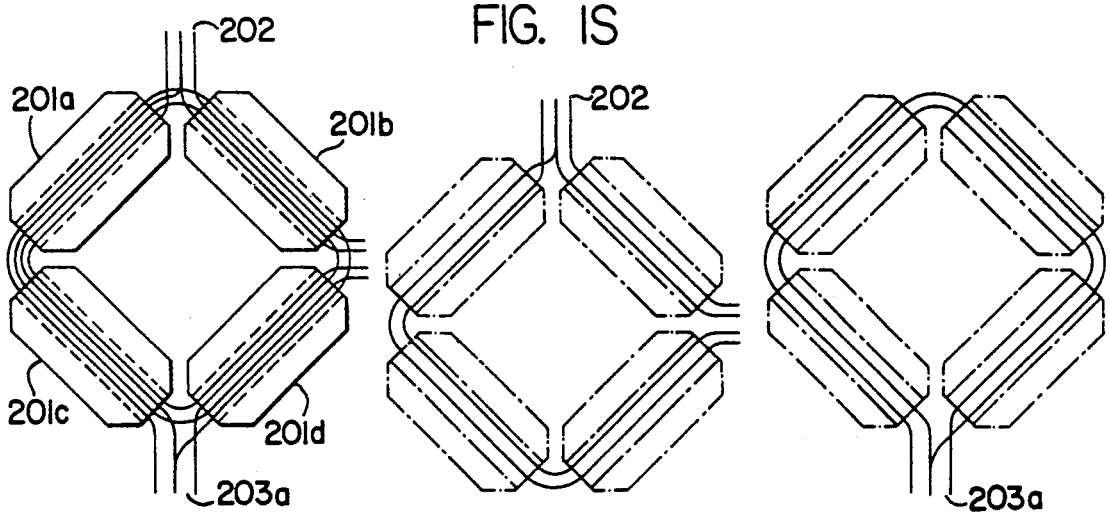
FIG. 2 is a larger scale drawing of part of the transformer of FIG. 1, modified to illustrate push-pull (centertapped) windings.
FIG. 2P shows the transformer of FIG. 2, with the primary winding emphasized.
FIG. 2S shows the transformer of FIG. 2, with the secondary windings emphasized.

FIG. 2 is a portion of the transformer of FIG. 1, drawn to a larger scale, but showing the primary winding 202 and the secondary winding 203a in a center-tapped configuration.

Note particularly the arrangements of the secondary windings, for example, winding 103a (the others are similar). Magnetic elements 101a,b,c,d, shown as long slender toroids, have been placed end to end in a closed pattern so that the start of winding 103a is located with its end. This allows the winding 103a to be inclosed almost entirely within the high frequency matrix transformer.

The entire secondary circuit includes all wires outside of the transformer, from the transformer terminations to its loads and back, as well as the windings of the transformer. Usually the external circuitry can be minimized by keeping the start and the end of the winding together. This is disirable, because the leakage inductance of the leads is the principle source of leakage inductance for the high frequency matrix transformer. Obviously, if the start of the winding and its end are not at the same point, there has to be an external return path to close the circuit. (There are circumstances where it is necessary, or even desirable to have the start and the end not located together, and there are well known techniques for minimizing the inductance of the external leads if necessary.)

Note also that the primary winding 102 has been arranged so that its start and its end are at the same place. The same considerations discussed for the secondaries apply to the primary as well.

Note that the terminations of primary winding 102 are located as far away as possible from the nearest terminations of any of the secondary windings 103a,b. This is done to reduce the capacitive coupling from the primary input to the secondary output.

Note that each winding has one wire, the minimum number of wires that is possible. (In the high frequency matrix transformer of FIG. 2 having push-pull windings, normally one side is conducting at a time, so it is equivalent to a one wire winding). This is done to reduce eddy current losses due to the proximity effect, and to improve coupling.

Note that the magnetic elements 101a,b,c–t are long slender cores. These cores are preferably made from a magnetic material which is suitable for high frequency operation, such as a ferrite. There is a trade off involving the geometry of the core. Given an operating voltage and frequency, the necessary flux capacity of the cores can be calculated using the ordinary and well understood equations of transformer design. The optimum flux density, however, is not as simple to determine.

The starting point for determining flux density will probably be thermal considerations. Through a process of budgeting losses, and considering available heat sinking and acceptable temperature rise, one can arrive at a target for the acceptable power loss for each magnetic element. In the case of the transformer of FIG. 1, this will be one twentieth of the acceptable power loss for the whole transformer.

Given that the flux capacity of the core and the frequency are known, and a target power has been established, the flux density is chosen using the core manufacturer's data for core loss per unit volume. This is minimized when the ratio of the cross sectional area of the core to its volume is maximum. This occurs when the inside diameter of the core is minimum, and the length is maximum.

The power loss in the wire, however, is minimized when the wire is short and fat. One can trade off core losses versus wire losses to reach the optimum design. The wire loss calculations are made simpler by the fact that the primary and secondary currents are equal in any one element (neglecting magnetization current).

When calculating the wire losses, penetration depth must be considered. It is a significant factor at high frequencies. The use of litz wire is not necessarily beneficial, however. It has a much reduced equivalent cross section, and even though the center of an ordinary wire is lost to electrical conduction, it is still there for heat conduction. Besides, ordinary wire is much easier to work with.

In general, magnetic materials are very lossy at high frequencies, and the high frequency matrix transformer tends to have short windings. Often the magnetic core losses will dominate, and it will prove to be impractical to try to balance core and wire losses.

There are a few additional factors to consider. A smaller inside diameter improves coupling. A larger inside diameter allows space for more insulation, which improves dielectric isolation and reduces capacitive coupling. A long skinny core has more surface area to volume, which improves heat dissipation. The thermal path from the center to the outside is shorter, and can be improved with the use of thermal compound. The thermal path along the wire (which is probably copper, and thus a very good heat conductor) is longer. Long slender cores are more fragile, and will tend to make a transformer which spreads out more.

High frequency transformers tend to run hot, so the transformer of FIG. 1 is shown with quite a lot of space around the cores, for improved ventilation or heat sinking. The cores can be packed much more tightly if it is preferred for a particular design. Heat sinking can be improved if the contour of the heat sink contacts the outside of the cores. Cores with a flat side can be used to provide better thermal contact with a flat heat sink surface.

Because of the excellent thermal properties of matrix transformers, including high frequency matrix transformers, both the flux density and the current density can be very much greater than in ordinary transformers.

The outputs of a matrix transformer are usually be tied in parallel. The high frequency matrix transformer would seem to be a paradox, in that the ends of each section of the secondary winding have been kept close together, but the various parts of the secondary winding are spread apart. This can be useful, however. A prevalent use for a high frequency transformer is in a direct current power supply. Each output of the secondary can have its own rectifier (and perhaps its own filter too), the currents being combined as a direct current. Inductance is of little consequence in a DC circuit. It is the nature of a matrix transformer that each secondary circuit will have the same current. This is ideal for a rectifying circuit, and having the various outputs separated will improve heat sinking for the rectifiers.

Figure 3:
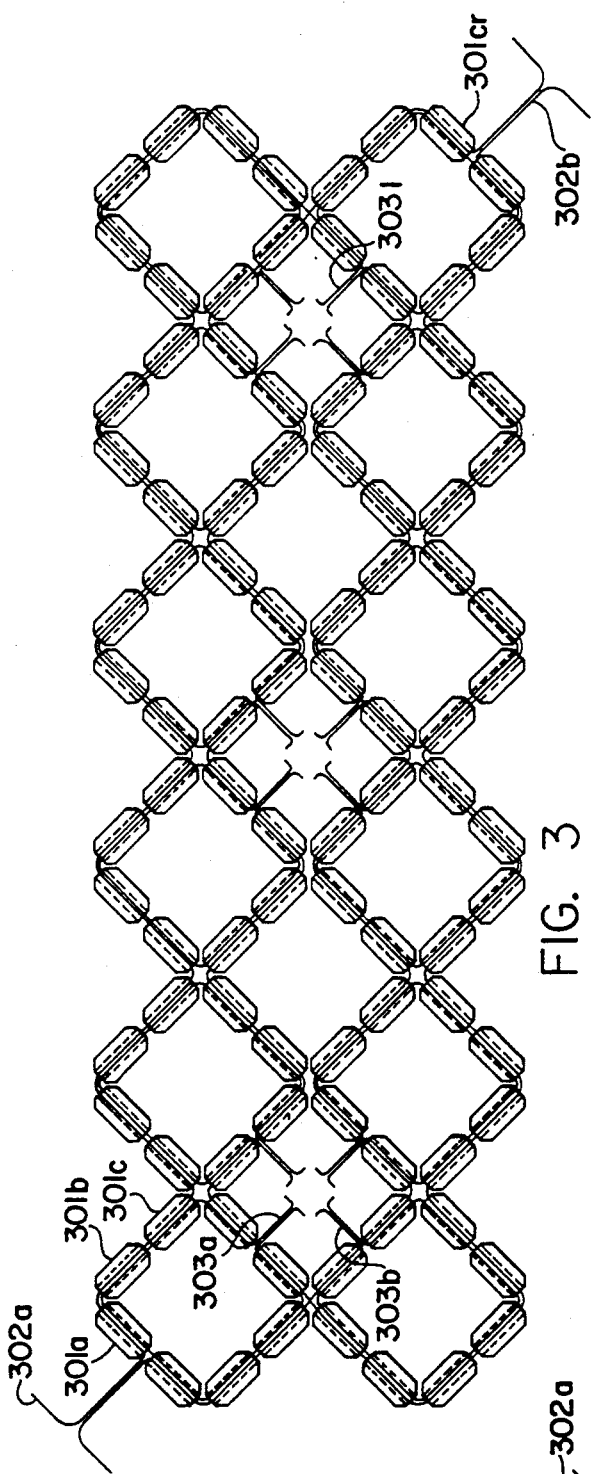
FIG. 3 is a portion of a more complex high frequency matrix transformer.

FIG. 3 shows a diagrammatic representation of high frequency matrix transformer having 96 magnetic elements 301$a,b,c-cr$. It has two primaries 302$a$ and 302$b$ and twelve secondary windings 303$a,b,c-l$. The primary windings 302$a,b$ each interconnect 48 of the magnetic elements 301$a-cr$. The secondary windings 303$a-l$ each interconnect eight magnetic elements each, as a matrix transformer.

Figure 3S:
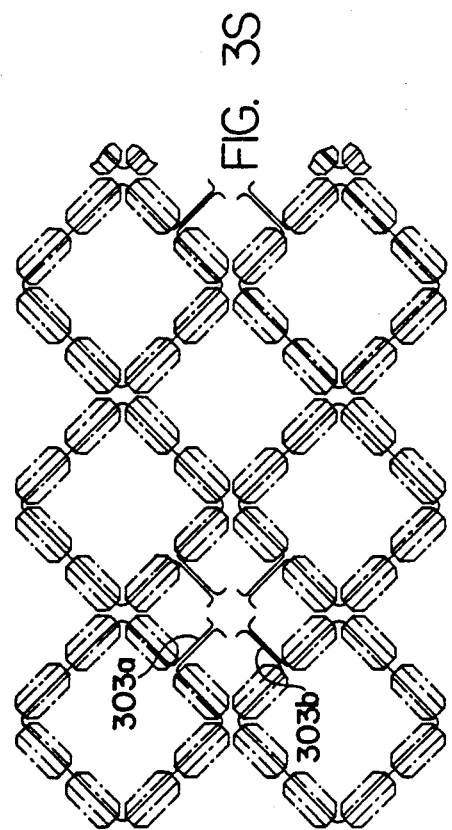
FIG. 3S shows a portion of the transformer of FIG. 3, with the secondary windings emphasized.
Figure 3P:
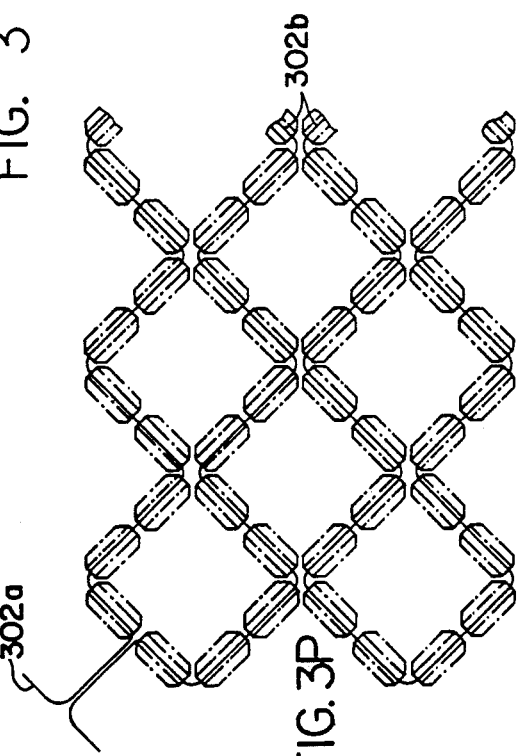
FIG. 3P shows a portion of the transformer of FIG. 3, with the primary windings emphasized.

FIG. 3P shows one end of the transformer of FIG. 3, with the primary windings emphasized. It can be seen that it has two parallel primary windings 302$a,b$. Parallel primaries can be useful in a matrix transformer for many reasons. One would be to divide the primary current among parallel switching means. The current will share equally without extraneous parts. Another reason would be to provide a transformer that could work with two input voltages, one twice the other. The windings could be in series for the higher voltage, and in parallel for the lower voltage. This would be particularly useful for a converter circuit, such as a switch mode power supply, if isolated driving means were provided for the switching means. Effective dual voltage operation, such as 120/240 volts could be provided. The high frequency matrix transformer can be designed with any number of parallel primary circuits.

FIG. 3S shows one end of the transformer of FIG. 3, with the secondary windings emphasized. The magnetic elements 301$a-or$ and the windings interconnecting them have been arranged and disposed in the manner of a matrix transformer so that the secondary windings 303$a-l$ are terminated in three groups of four secondaries, and within each group, the starts and the ends of the windings are located very closely together. The four windings in each group can be tied in parallel, carefully observing polarity. As is the nature of matrix transformers, each secondary will have the same current, (which is equal to the primary current). Each grouped output so constructed will carry four times the current of any one secondary winding, which is one third of the total secondary output current. In a matrix transformer, this current relationship is quite precise, (the error being differences in magnetization current among the elements), so long as the loads are not so unequal that there is insufficient flux capacity to provide the necessary voltage.

This arrangement can be used to drive three rectifier circuits, each located very close to one of the secondary output groups, perhaps on the other side of a common mounting plate or heat sink. In such an arrangement, the lead length is minimal. The current through each rectifier is the same magnitude, with no extraneous parts needed to ensure current sharing.

By carefully tracing the windings of the transformer of FIG. 3, it can be seen that each of the primary windings 302$a,b$ couples to all of the secondary windings 303$a-l$ in at least one magnetic element. Note in particular that the first primary winding 302$a$ crosses over the second primary winding 302$b$ in two places to accomplish this. When laying out the windings of a matrix transformer, one must be very careful to observe polarity, and to ensure that each winding couples the right number of cores. It is helpful to draw arrows to represent current flow, and to keep track of voltage drop (potential) in each element.

Since the net ampere turns in any elemental magnetic circuit must be zero (neglecting magnetization currents), the currents in coupled circuits having equal turns (in this case, one) must be equal. Also, the current within any one winding must be equal everywhere along its length. It can thus be seen that the current in any winding must be equal to the current in any other winding. There being two primary windings and twelve secondary windings, the equivalent turns ratio of this transformer is six to one. If the primaries are in series, the ratio will be twelve to one.

Figure 5:
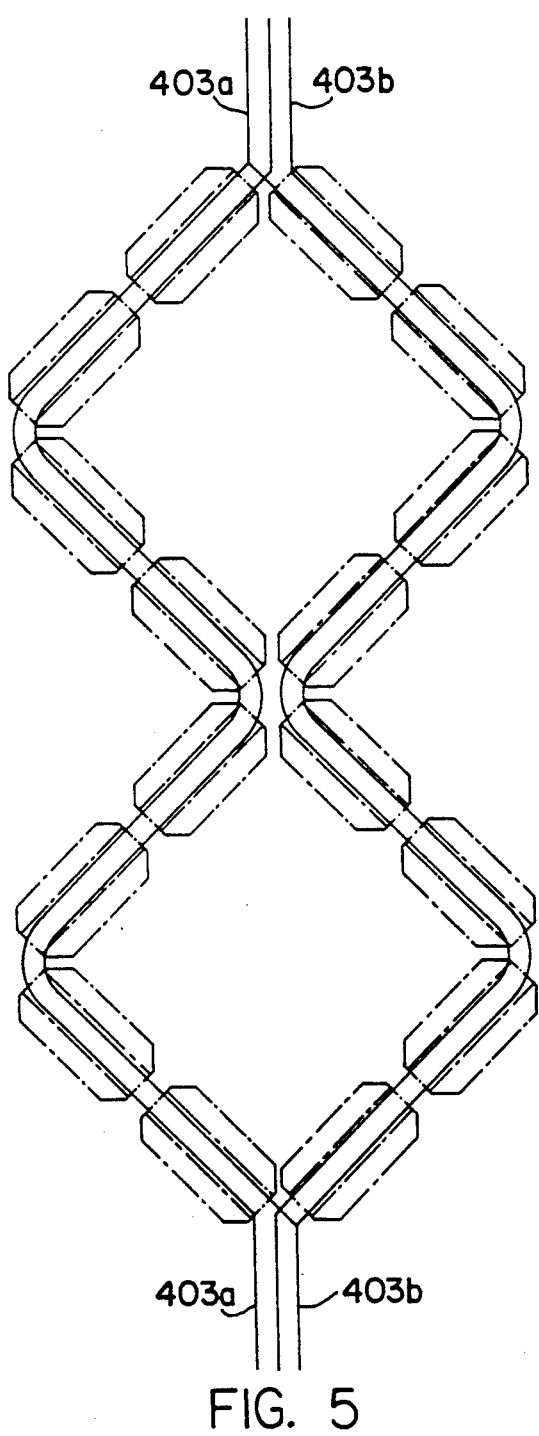
FIG. 5 shows a part of the secondary circuit 402a,b of FIG. 4S, enlarged to more clearly show its winding detail.

FIGS. 4P and 4S are alternative windings for the transformer of FIG. 3. FIG. 5 shows a part of the winding of FIG. 4S, to show the detail of the secondary winding more clearly. There are two primaries 402$a,b$, and twelve secondaries, 403$a,b-l$. Note that the secondaries 402$a-l$ are centertapped. These windings have been designed with a minimum of crossovers, and none within the transformer itself, so they would be suitable for printed circuit layout. A hypothetical application would be a switch mode power supply with full or half bridge primaries and push-pull rectified secondaries. If the full or half bridge primary circuits had isolated drive means, then they could be used in parallel or in series, to provide dual input voltage capability.

Note that in any one of the secondary circuits, for instance the first secondary circuit 402$a$, the centertab and the ends of the winding are not located together, which is inconsistent with the teaching that the start and the end of a winding in a high frequency matrix transformer should be close together. However, the second secondary circuit 403$b$ is similar but reversed, and carries an equal current into and out of the same points on the transformer. The criteria for satisfactory high frequency performance are satisfied if equal and opposite currents are paired, even if they are in different circuits.

FIG. 6 shows another embodiment of the high frequency matrix transformer in which the start and the end of the secondary windings 603$a,b-f$ are not located together, but are terminated on separate terminals 604$a,b$. A primary winding 602 couples 24 magnetic elements 601$a,b-w$. The magnetic elements are shown spaced apart for clarity, but could and should be packed tightly. This arrangement would be useful if the load to which the transformer were connected had terminals which were spaced apart, and for instance, co-located with the terminals of the transformer 604$a,b$. Total circuit leakage inductance would be reduced by reducing the length of the external leads.

Figure 7:
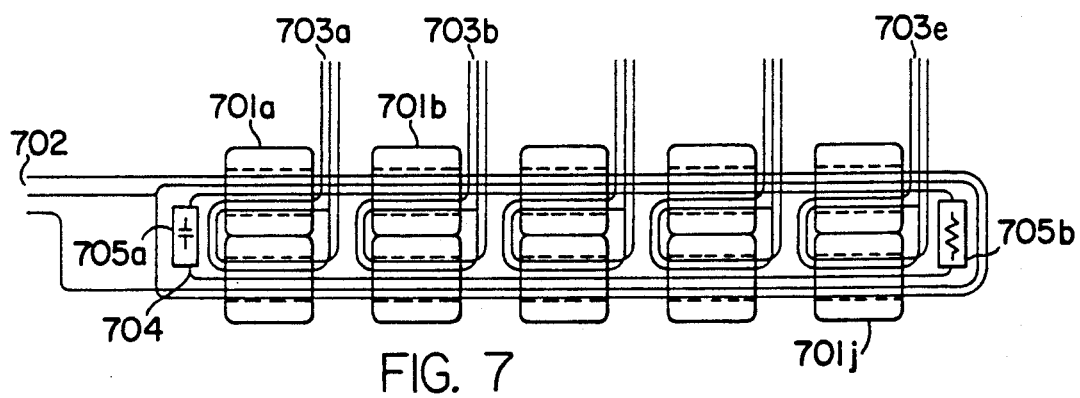
FIG. 7 shows another embodiment of the high frequency matrix transformer, having an extra winding which could be used for dampening (snubbing).

FIG. 7 shows another embodiment of the high frequency matrix transformer. Again, the five magnetic elements 701$a,b-j$ have been shown space apart, for clarity, but preferable should be closely packed. Pairs of magnetic elements are wound with push pull secondary windings 703a,b-e. This transformer has a ratio of five to one, but could be extended to any arbitrary equivalent turns ratio by adding additional magnetic elements and secondary circuits.

Note that the transformer of FIG. 7 has an extra winding 704 with components 705a,b, shown for illustration as a resistor and a capacitor. This can serve as a dampening (snubbing) circuit. An auxiliary winding for snubbing could be provided on each core individually, or on groups of cores.

A high frequency matrix transformer similar to the one in FIG. 7 can be made with ferrite cores such as Fair-rite (tm) part no. 2677006301, which are about ⅜" outside diameter. The primary and secondary windings can be made with awg 22 teflon hook up wire. If the primary and secondary windings are each inside a number 12 teflon sleeving, the transformer will meet very high dielectric isolation requirements. (In test, there was no dielectric failure to the limit of the available test equipment: 40,000 VDC) The snubbing winding carries very little current, and can be awg 30 or smaller.

The transformer was installed in a bread board of a push-pull pulse width modulated switch mode power supply. The input voltage was 40 to 60 volts, with 5 volts out. The primary was driven with a Unitrode (tm) part no. 3825 integrated circuit, buffered to improve the output fall time. The primary switches were n-channel power MOSFET's (metal-oxide-silicon field effect transistors). The individual secondaries were rectified with dual Schottky rectifiers. The individual secondary centertabs were connected to ground through small inductors. The anodes of the pairs of rectifiers were connected together and to small ceramic capacitors, which was returned to ground, the whole being kept very tight. The outputs were then paralleled.

No primary snubbers were used, the drain-source capacitance of the FET's apparently being more than adequate to absorb the stored energy in the primary. The auxiliary winding was used to damp ringing (which was in the order of 20 MHz). The bread board was operated a 1 MHz (500 kHz primary frequency) with 250 watt output (5 volt at 50 amperes). The transformer obviously had much greater capacity, and was limited by the test circuit.

Snubbing at high frequencies becomes a problem, because any snubbing network compose of individual parts necessarily has leads. As short and as tight as one keeps them, the lead inductance still compromises effectiveness. The high frequency matrix transformer provides an opportunity to use distributed snubbing.

In a transformer of conventional design, particularly one designed for higher frequencies and power, temperature rise is such a problem that losses must be vigorously controlled. The problem of losses in the matrix transformer are readily solved by spreading it out as much as necessary, and it can be heat sunk or ventilated easily. It therefor becomes a reasonable option to allow more loss in the transformer if it benefits the overall design.

Several losses can be identified as frequency dependant. If the frequency components of the transient or oscillation that is being suppressed are high compared to the operating frequency, then distributed snubbing can be used by selecting materials whose losses increase rapidly with frequency. Examples are lossy dielectrics or magnetic materials, and the use of larger conductors, which increases eddy current losses. Losses in magnetic materials can be due to the DC hysteresis curve, or to eddy currents, which have different frequency dependance. Better snubbing can be expected with a material with low hysteresis and higher eddy current losses, such as Manganese zinc ferrite than with one that has higher hysteresis loss and lower eddy current losses, such as Nickel zinc ferrite, if losses at the fundamental frequency of operation are acceptable. (Eddy currents that are not lossy are not useful, however. They may cause an unacceptable inrush current, or out of phase currents, and may worsen oscillations).

The transformer of FIG. 7 is well adapted to the use of lossy dielectrics for snubbing. An analysis of the voltages in the primary show that the voltage difference between the two primary windings is the same in each core. Thus the electric field is the same in each, and dielectric losses would be evenly distributed.

A lossy dielectric between the primary windings (perhaps incorporated in their insulation) is equivalent to a distributed R-C network, without lead inductance, only better. Any heat generated is evenly spread, and there are no discrete components to fail.

Figure 8:
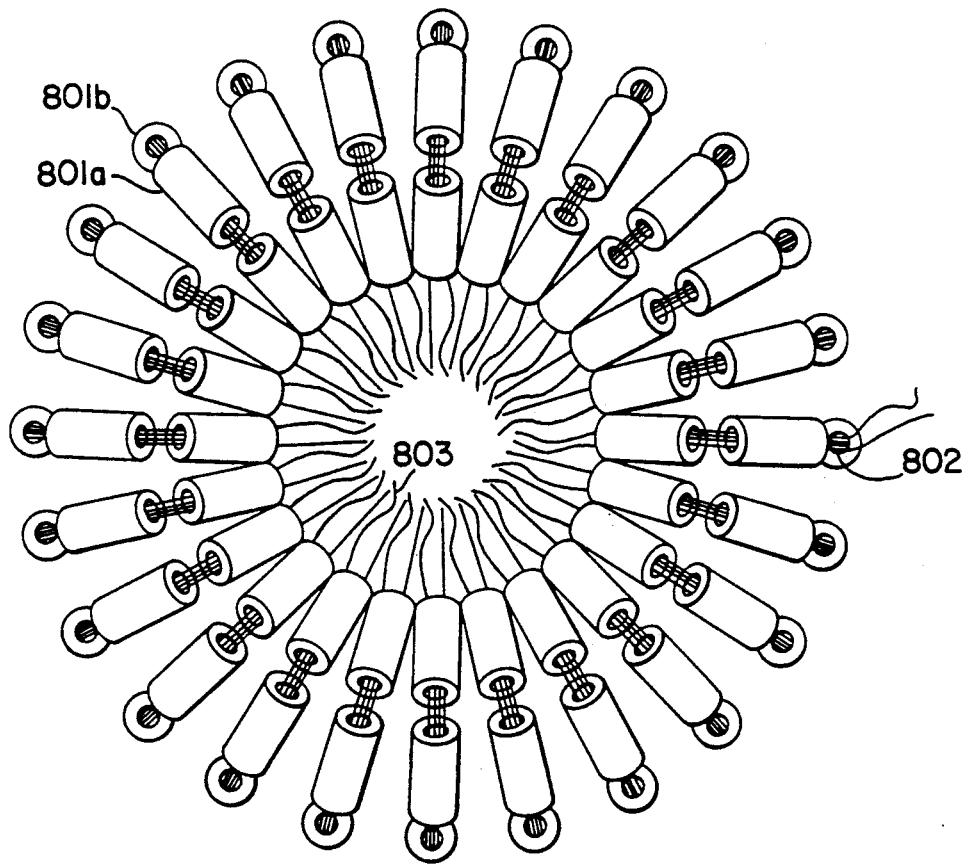
FIG. 8 shows a high frequency matrix transformer having a high equivalent turns ratio (in the order of 24:1).

FIG. 8 shows a high frequency matrix transformer which is particularly well suited for applications where a single output termination is desired. The primary winding 802 interconnects magnetic elements 801a,b, etc., essentially in a helix which has been closed on itself to form a toroid. A plurality of windings comprise the secondary 803. As shown, 24 parallel secondary circuits each couple one turn of the helix. Such helixes could be stacked to provide very large turns ratios.

Figure 9:
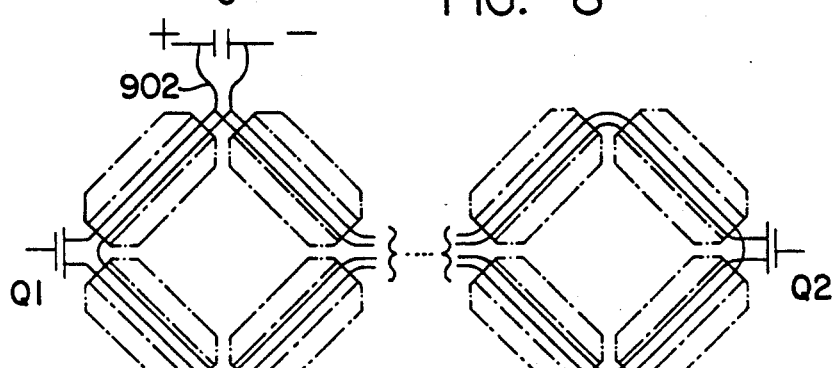
FIG. 9 shows a push pull primary circuit, suitable for high frequency matrix transformer of FIG. 1, having switching means located within it.

FIG. 9 shows a push pull primary circuit 902 for a high frequency matrix, which would be suitable for the transformer of FIG. 1. Only the end sections of the transformer are shown, to simplify the drawing. The input and return are designated "+" and "−" respectively, and a capacitor "C" is shown diagramatically to indicate how tighly input filtering can be coupled to the transformer. The two halves of the push pull winding 902 are broken and brought to switching means, illustrated as insulated gate field effect transistors (FET's) Q1 and Q2. Switching means for push pull windings are usually at the ends of the winding, but this invention teaches that they can be anywhere within it as well. The location of Q1 and Q2 are chosen to be tightly coupled to the transformer, yet separated from each other and other circuit components for improved heat sinking. Isolated gate drives would be prefered for this circuit.

Figure 10:
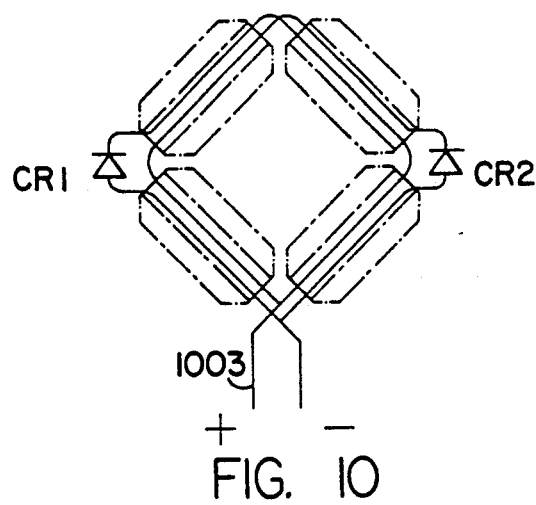
FIG. 10 shows a push pull secondary circuit, suitable for the high frequency matrix transformer of FIG. 1, having rectifying means located within it.

FIG. 10 shows a push pull secondary circuit 1003 which would be suitable for the transformer of FIG. 1. The start output and return are designated "+" and "−", and each half is broken and taken to a rectifying means, shown as diodes CR1 and CR2. Rectifiers for push pull secondary circuits are usually at the ends of the winding, but this invention teaches that they can be located at any convenient point along the winding. This could be done to optimize heat sinking, and would allow much tighter coupling of the output filter circuits to the transformer. For example, both windings could be wound on a common inductor which could be very close to the transformer, with a good filter capacitor right at the inductor terminals.

If care is taken to ensure correct polarity and potential, the rectifing means illustrated by CR1 and CR2 in FIG. 10 can be common to several parallel paths of the secondary winding, it being necessary only to arrange and dispose the secondary winding such that a suitable common point were brought together at the rectifying means.

Figure 11:
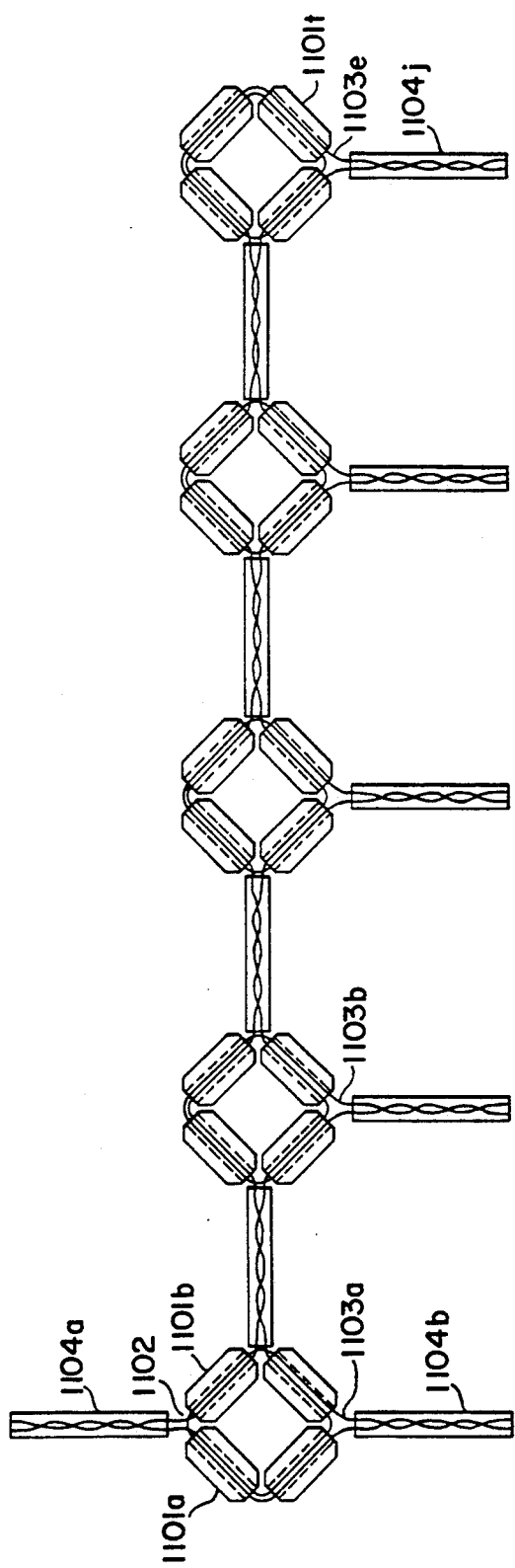
FIG. 11 shows that the various parts of a high frequency matrix transformer can be physically separated, and, if necessary, the source and loads can be physically separated as well. Interconnecting means having a low inductance are used.

FIG. 11 is included to show that the various parts, as well as the inputs and outputs can be separated, and joined by conducting means 1104a,b–j having good high frequency transmission characteristics, such as shielded twisted pair, coaxial wire, strip lines or wide, flat busses. Magnetic elements 1101a,b–t are wound with a primary 1102 and secondaries 1103a,b–e, quite similar to transformer of FIG. 1.

Figure 12:
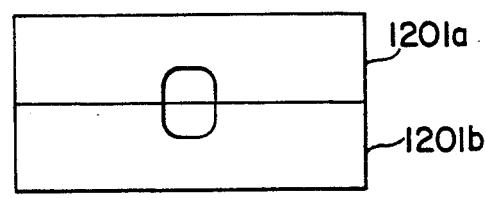

FIG. 12 and FIGS. 13A and 13B illustrate a transformer core for a high frequency matrix transformer. FIG. 12 shows the core assembled using two identical parts 1201a and 1201b. Either one could be replaced by a flat plate, it being similar except for some loss of winding area. FIGS. 13A and 13B show a plane and elevating view of the core 1301. This core allows a winding that closes on itself, and also is well configured for a more complex winding in that a plurality of such cores could be placed side by side, and the windings could extend from core to core as necessary.

Figure 14B:
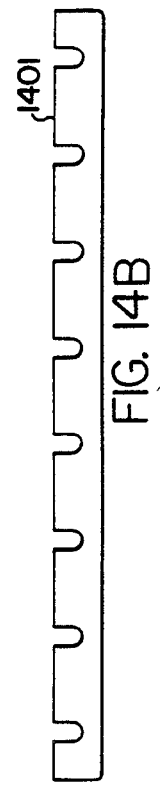
Figure 14A:
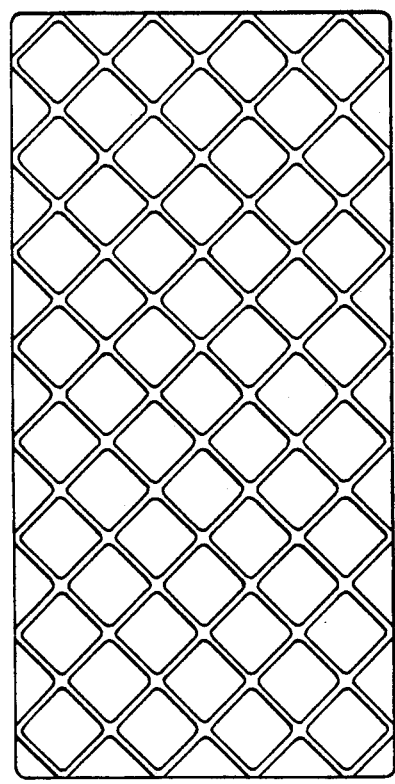

FIGS. 14A, 14B and 15 a transformer core for a high frequency matrix transformer having a first core part 1401 comprising a slab of magnetic material with a plurality of grooves cut or molded therein, suitably disposed for use in a high frequency matrix transformer. A transformer could be made with a pair of such core parts, or with one such core part and a flat slab 1501.

Figure 16A:
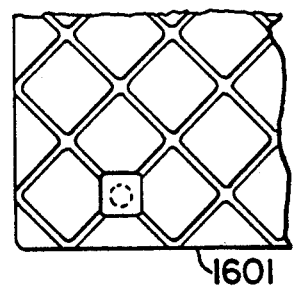
FIGS. 16A and 16B show a core for a high frequency matrix transformer having provision for mounting semiconductors or the like therein, with heat sinking means.
Figure 16B:
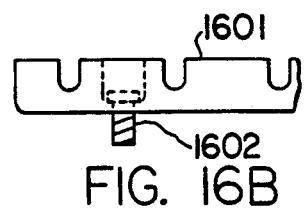

FIGS. 16A and 16B show a portion of a core part 1602 suitable for a high frequency transformer, and having therein mounting means 1602 suitable for semiconductors or the like. The treaded stud of the mounting means could provide mounting means for the transformer as a whole, and would provide heat sinking. This core would be useful for a high frequency transformer such as the transformer of FIG. 10, and would be assembled as the transformer of FIG. 15.

I claim:

1. A high frequency matrix transformer, comprising:
   a plurality of interdependent magnetic elements arranged in a matrix and having at least two windings interconnecting the interdependent magnetic elements so that each of the windings comprises at least one current carrying conductor path between and through the interdependent magnetic elements, one of said at least two windings comprising a primary circuit and another of said at least two windings comprising a secondary circuit;
   each winding comprising said at least one current carrying conductor including a first end and a second end,
   said winding comprising said primary circuit being arranged so that its first end passes through a first interdependent magnetic element and is located in a spaced relation to its second end, said second end passing through a second interdependent magnetic element adjacent said first interdependent magnetic element, and
   said winding comprising said secondary circuit being arranged so that its first end passes through a third interdependent magnetic element and is located in a spaced relation to its second end, said second end passing through a fourth interdependent magnetic element adjacent said third interdependent magnetic element.

2. A high frequency matrix transformer as defined in claim 1 further comprising a plurality of secondary circuits wherein the interdependent magnetic elements associated with one secondary circuit are disposed and intertwined such that the first and second ends of said one secondary circuit are located in a spaced relationship with the first and second ends of another of the secondary circuits in said plurality of secondary circuits.

3. A high frequency matrix transformer as defined in claim 1 further comprising a plurality of secondary circuits wherein the interdependent magnetic elements associated with one secondary circuit are disposed and interwired such that the first and second ends of said one secondary circuit are located in proximity to the first and second ends of another of the secondary circuits in said plurality of secondary circuits.

4. A high frequency matrix transformer as defined in claim 1 further comprising a plurality of secondary circuits wherein said plurality further comprises a number of sets of secondary circuits, each of said sets of secondary circuits having at least one winding and each winding having its associated interdependent magnetic elements disposed and interwired such that the first and second ends of each winding associated with a respective secondary circuit in one of said number of sets of secondary circuits are located in proximity to the first and second ends of another secondary circuit in said one of said numbers of sets of secondary circuits and the first and second ends of each winding associated with a respective secondary circuits in another of said number of sets of secondary circuits being located in proximity to the first and second ends of another secondary circuit in said another of said numbers of sets of secondary circuits, said first and second ends of said secondary circuits in said one set being located in a spaced apart relationship with said first and second ends in said another set.

5. A high frequency matrix transformer as defined in claim 1 wherein the first and second ends of a primary circuit are located in a spaced relationship with the first and second ends of a secondary circuit.

6. A high frequency matrix transformer as defined in claim 1 wherein said interdependent magnetic elements are cylindrically shaped having a longitudinal dimension substantially greater than its diameter thereby increasing the ratio of the cross sectional area of the magnetic element to its volume whereby the core loss per unit volume of the magnetic element is minimized.

7. A high frequency matrix transformer as defined in claim 1 further including said plurality of interdependent magnetic elements being arranged such that each magnetic element is disposed in a spaced apart relationship with an immediately adjacent magnetic element to facilitate thermal conductivity from the transformer.

8. A high frequency matrix transformer as defined in claim 1 further comprising said interdependent magnetic elements and said primary and secondary circuits being arranged and disposed such that a current carrying conductor associated with one primary circuit does not cross a current carrying conductor associated with a different primary circuit and wherein a current carrying conductor associated with one secondary circuit does not cross a current carrying conductor associated with a different secondary circuit.

9. A high frequency matrix transformer as defined in claim 1 wherein said windings comprise material having a lossy dielectric characteristic to produce distributed dampening of high frequency transient signals.

10. A high frequency matrix transformer as defined in claim 1 wherein said windings comprise magnetic material to provide distributed dampening of high frequency transient signals.

11. A high frequency matrix transformer as defined in claim 1 further comprising said interdependent magnetic elements being arranged in a helix.

12. A high frequency matrix transformer as defined in claim 11 wherein said helix is closed on itself to form a toroidal shaped high frequency matrix transformer.

13. A high frequency matrix transformer comprising transformer core means having a body made of a magnetic material, said body having two major surfaces disposed generally opposite each other, at least one of said surfaces further including a number of means forming grooves, said groove means arranged and disposed to receive at least one current carrying conductor forming a winding of a matrix transformer.

14. A high frequency matrix transformer as defined in claim 13 wherein said transformer core means comprises a first and second body each being substantially identical to one another, said first and second bodies being arranged in a surface-to-surface complementary relationship such that the grooves in the surface of said first body are in registration with the grooves in the surface of said second body, said surfaces of said first and second bodies being in contacting relation with one another.

15. A high frequency matrix transformer as defined in claim 13 wherein said transformer core means further includes slab of magnetic material having at least one major surface and of substantially the same surface configuration as the major surface containing said grooves in said body, said major surface of said slab and said grooved surface being in a contacting surface-to-surfacee relation with one another.

16. A high frequency matrix transformer as defined in claim 13 further comprising said body having at least one cavity in said grooved major surface, said cavity having means for accomodating at least one component circuit element associated with an electronic circuit with which said matrix transformer forms a part thereof.

17. A high frequency matrix transformer as defined in claim 16 wherein said at least one component circuit element is a heat sinking means.

18. A high frequency matrix transformer as defined in claim 16 wherein said at least one component circuit element is a mounting means for said transformer core means.

19. A high frequency matrix transformer as defined in claim 18 wherein said mounting means is a heat sinking means.

* * * * *